(12) United States Patent
Gäbler

(10) Patent No.: US 11,276,787 B2
(45) Date of Patent: Mar. 15, 2022

(54) SEMICONDUCTOR DEVICE FOR LIGHT DETECTION

(71) Applicant: X-FAB Semiconductor Foundries GmbH, Erfurt (DE)

(72) Inventor: Daniel Gäbler, Apolda (DE)

(73) Assignee: X-FAB Semiconductor Foundries GmbH, Erfurt (DE)

( * ) Notice: Subject to any disclaimer, the term of this patent is extended or adjusted under 35 U.S.C. 154(b) by 0 days.

(21) Appl. No.: 16/854,133

(22) Filed: Apr. 21, 2020

(65) Prior Publication Data

US 2020/0343389 A1 Oct. 29, 2020

(30) Foreign Application Priority Data

Apr. 25, 2019 (GB) .................................. 1905789

(51) Int. Cl.
| | |
|---|---|
| H01L 31/02 | (2006.01) |
| H01L 27/144 | (2006.01) |
| H01L 49/02 | (2006.01) |
| H01L 31/0216 | (2014.01) |
| H01L 31/107 | (2006.01) |
| H01L 31/18 | (2006.01) |

(52) U.S. Cl.
CPC .... *H01L 31/02027* (2013.01); *H01L 27/1443* (2013.01); *H01L 27/1446* (2013.01); *H01L 28/20* (2013.01); *H01L 31/02161* (2013.01); *H01L 31/107* (2013.01); *H01L 31/1804* (2013.01)

(58) Field of Classification Search
CPC ......... H01L 31/02027; H01L 31/02161; H01L 31/107; H01L 31/1804; H01L 27/1443; H01L 27/1446; H01L 27/1463; H01L 27/1462; H01L 28/20; H01L 27/14643
See application file for complete search history.

(56) References Cited

U.S. PATENT DOCUMENTS

| | | | | |
|---|---|---|---|---|
| 2004/0097018 A1* | 5/2004 | Lee | ...................... | H01L 27/1126 438/128 |
| 2011/0139961 A1* | 6/2011 | An | ...................... | H01L 27/14601 250/207 |
| 2018/0323229 A1* | 11/2018 | Nouri | ...................... | G01J 1/4228 |

(Continued)

FOREIGN PATENT DOCUMENTS

| | | |
|---|---|---|
| KR | 1020130056485 | 5/2013 |
| KR | 1020120124559 | 11/2014 |
| KR | 1020160053548 | 5/2016 |

OTHER PUBLICATIONS

Zhang et.al. "Refractive index and extinction coefficient of doped polycrystalline silicon films in infrared spectrum" IOP Conf. Series: Materials Science and Engineering 108 (2016) 012020.*

(Continued)

*Primary Examiner* — Sitaramarao S Yechuri
(74) *Attorney, Agent, or Firm* — Dority & Manning, P.A.

(57) ABSTRACT

A semiconductor device for light detection comprises:
  a photodiode comprising an optical active region; and
  a resistor connected to said photodiode and overlapping at least a part of said optical active region, wherein the resistor comprising an anti-reflective coating for reducing reflection loss.

13 Claims, 6 Drawing Sheets

(56) References Cited

U.S. PATENT DOCUMENTS

2019/0352534 A1* 11/2019 Mesa .................. H01L 31/0481

OTHER PUBLICATIONS

Lam et. al. "Improved optical absorption and photocurrent of GaAs solar cells with hexagonal micro-hole array surface texturing" Journal of Crystal Growth 370 (2013) 244-248 Elsevier B.V (Year: 2013).*
Lam et. al. "Improved optical absorption and photocurrent of GaAs solar cells with hexagonal micro-hole array surface texturing" Journal of Crystal Growth 370 (2013) 244-248 Elsevier B.V (Year: 2013) (Year: 2013).*
Combined Search and Examination Report for corresponding GB Application No. GB1905789.2, dated Oct. 8, 2019—6 pages.

* cited by examiner

SEMICONDUCTOR DEVICE FOR LIGHT DETECTION

PRIORITY CLAIM

The present application is based on and claims priority to United Kingdom Application Serial No. 1905789.2, having a filing date of Apr. 25, 2019, which is incorporated by reference herein.

TECHNICAL FIELD

The invention concerns a semiconductor device for light detection.

BACKGROUND

Semiconductor light detectors based on the photodiode are in common use. For example, a Silicon Photomultiplier (SiPM) is used to detect light and comprises an array of individual pixels on a common substrate. Each pixel comprises a photodiode such as Single Photon Avalanche Diode (SPAD).

A SPAD operates by applying a reverse bias that is greater than the breakdown voltage of the diode. A single charge carrier in the depletion region can thereby cause a self-sustaining avalanche through impact ionization, which enables the detection of a single photon.

After the SPAD has been triggered a current will continue to flow until the bias voltage is reduced to the breakdown voltage or below. To reduce the bias voltage, and thereby reset the SPAD, the diode can be loaded with a resistor over which the voltage drops. This is referred to as a Passive Quenching Circuit (PQC). FIG. 1 shows a circuit diagram of a passively quenched SPAD device 2 having a photodiode 4, a reverse bias voltage supply 6 and a quenching resistor 8. The voltage drop V across the quenching resistor 8 is measured. The voltage pulse is used as information that an avalanche event has happened. Without an event, the voltage of the source 6 drops nearly completely across the diode 4 (in reverse bias). Passively quenched SPADs require high ohmic resistors, which occupy a significant area and thus lower the fill factor and reduce the sensitivity of such devices. Alternatively, an active quenching circuit can be used, which actively reduces the bias voltage after the SPAD has been triggered.

In a SPAD or other photodiode device, an anti-reflective coating (ARC) may be used over the optical active region to reduce reflection losses, which occur because of the difference in refractive index at the silicon interface. An ARC layer can thus improve the light sensitivity of the device.

European Patent Publication 2040308 describes a photodiode array comprising a plurality of SPADs with passive quenching circuits.

SUMMARY OF THE INVENTION

Aspects of the present invention provide semiconductor devices for light detection, and methods of forming such, as set out in the accompanying claims.

Preferred embodiments of the invention are described below with reference to the accompanying drawings.

DETAILED DESCRIPTION

Embodiments of the invention provide a semiconductor device for light detection having a resistor which is also an anti-reflective coating (ARC). This allows the resistor to overlap the optical active region of the device, without decreasing the light sensitivity of the device. The resistor can have a refractive index between that of silicon and silicon oxide, so that the refractive index is gradually increased along the path of incident light, thereby reducing the reflection loss at the silicon interface. Because the resistor is located on the optical active region, the "inactive" area around and between such semiconductor devices can be reduced and the fill factor accordingly increased. For example, by positioning the resistor over the optical active region of a SPAD the density of SPADs in an SiPM can be increased.

Figure 1:
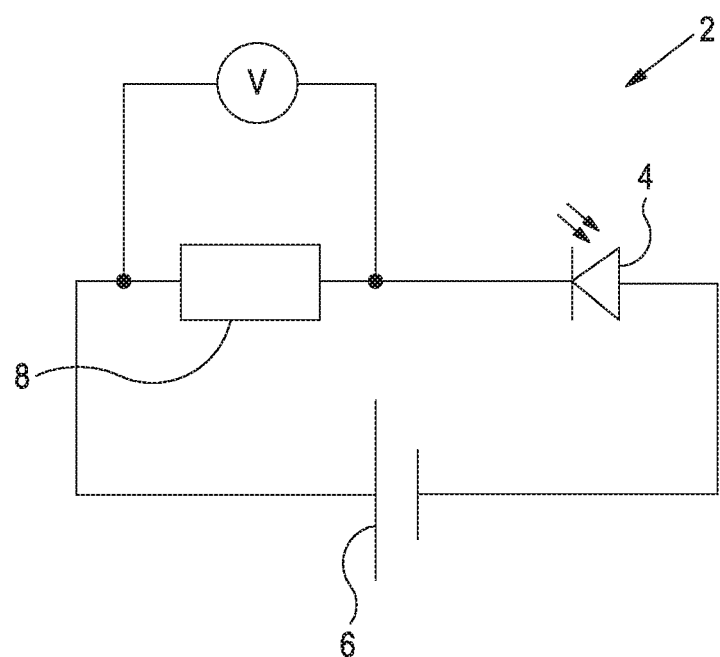
FIG. 1 shows a circuit diagram of a single photon avalanche diode.
Figure 2:
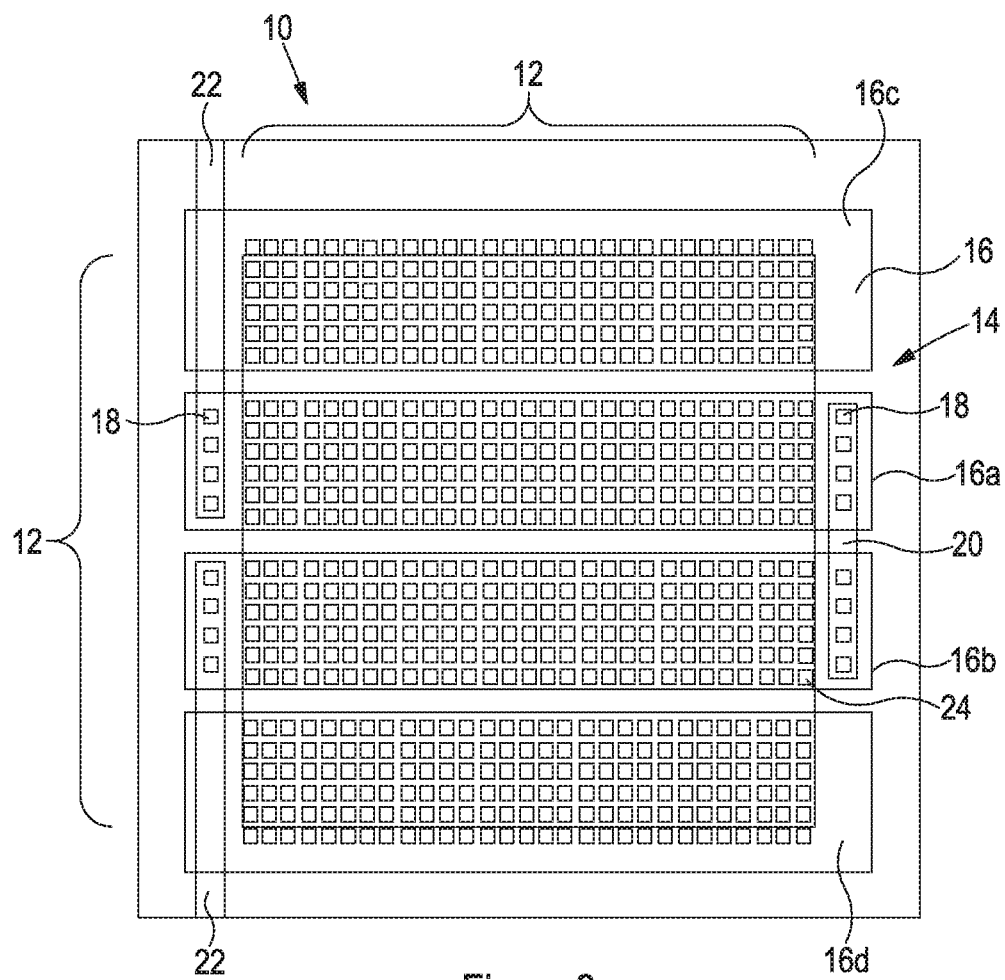
FIG. 2 shows a schematic diagram of a plan view of a semiconductor device according to an embodiment.

FIG. 2 shows a semiconductor device 10 (e.g. a SPAD) according to an embodiment. The device 10 has an optical active region 12 for absorbing incident photons. The optical active region 12 is the region around the pn-junction (not shown) in the device, within which absorbed photons can excite charge carriers to the conduction band to generate a photocurrent. A resistor 14, having a resistance in the range of 30 kΩ to 150 kΩ, is located on and overlaps the optical active region 12, forming part of an ARC layer. The resistor 14 comprises two strips 16a and 16b of a layer of patterned poysilicon 16 with metal contacts 18. A conductor 20 (typically a metal strip) connects the two strips 16a and 16b of polysilicon layer 16 together. Further conductors 22 can connect the resistor 14 to other devices or to an electrode (not shown). The polysilicon layer 16 comprises a plurality of square holes 24 filled with a dielectric material, typically silicon oxide ($SiO_2$). The combination of polysilicon and the dielectric material creates an effective medium with a refractive index in between that of the refractive index of the dielectric material and that of poysilicon. For example, silicon oxide has a refractive index of n=1.4 (for light in the visible spectrum, i.e. 300 nm<λ<750 nm) and polysilicon has a refractive index of n=3.5 (for light in the visible spectrum), and the effective medium can be designed to have a refractive index in between these two values (1.4<n<3.5). The target value of the refractive index will depend on the device application and in particular upon the materials of any other layers in the device. The semiconductor device of FIG. 2 comprises further strips 16c and 16d of patterned polysilicon 16, which are a part of the ARC layer, but which are not part of the resistor 14. By using such "dummy elements" along the edges of the optical active region 12 more consistent device behaviour can be achieved.

The polysilicon layer 16 is designed both to provide a desired resistance and a desired refractive index. The density of holes 24 can be increased to increase the ratio of silicon oxide in the layer, which thereby decreases the refractive index of the effective medium. Increasing the amount of oxide will also increase the resistance of the resistor 14. In this embodiment, the patterned polysilicon layer is used as the resistor 14, so that optical and electrical aspects are used at the same time and at the same location. No extra area is required to position the resistor 14, which would otherwise reduce the fill factor in a pixelated structure.

Preferably, the device 10 is formed in a standard Complementary Metal Oxide Semiconductor (CMOS) process, instead of requiring a dedicated (new) manufacturing process. In a standard CMOS process the polysilicon layer 16 is patterned using the "POLY" mask. In the preferred embodiment, no dedicated process steps have to be introduced to form the resistor 14 and ARC layer. This can make device manufacturing more efficient and significantly reduce those costs normally associated with developing and manufacturing a new device. Embodiments thereby solve the task of coupling light effectively into silicon without the usage of any processing step that is not already part of standard CMOS processing (<=0.18 μm node). Patterning of fine enough structures to produce an effective medium for wavelengths down to UV is feasible with 0.18 CMOS technology. POLY (inverse): CD 250 nm, spacing 180 nm.

If the semiconductor device 10 is a CMOS device, then the minimum dimensions of the holes 24 in the patterned polysilicon layer 16 are limited by the CMOS process. For example, forming the holes 24 using the "POLY" mask with 0.18 μm CMOS technology, the width of the squares is limited to a minimum of about 250 nm (the Critical Dimension, CD) and the spacing between neighbouring squares is limited to a minimum of about 180 nm. Similarly, for 90 nm CMOS technology, a hole spacing of 90 nm can be achieved. As a consequence, light having a wavelength comparable or smaller to the dimensions of the pattern will not see an effective medium, but will instead see individual regions of dielectric material and polysilicon respectively. Using a dedicated, non-CMOS process, to form the device can remove this disadvantage and provide more design freedom. However, it has been discovered that even for incident light having a wavelength close to or less than the CD, the patterned polysilicon layer can significantly reduce reflection. Although generally smaller holes 24 with smaller spacing is preferable to reduce the granularity of the effective medium, for IR applications holes 24 having a width of up to 700 nm and a spacing of up to 300 nm may be used.

Although FIG. 2 shows a polysilicon layer having square holes 24, hexagonal or round shapes are preferable in some applications. For example, having hexagonal holes may allow a greater packing ratio and thereby a greater ratio of silicon oxide, if the application requires a lower refractive index. Computer modelling and simulations may preferably be used to determine the optimal design of the polysilicon layer for a particular application. Hence, the thickness of the polysilicon layer and the shape and size of the holes can be chosen so as to form a resistor with a target resistance and a target refractive index.

In some CMOS processes there may be a Contact Stop Layer (CSL). This layer is a silicon nitride ($Si_3N_4$) or silicon oxynitride (SION) layer, which has a higher refractive index than silicon oxide. The CSL is needed for the contact etch to stop before reaching the silicon (or more precisely the silicide) and then to change the etching process for a soft landing. As a side effect the higher refractive index of this layer, reduces the difference towards the underlying silicon ($Si_3N_4$ n=2 to Si n=3.8->1.8, vs. $SiO_2$ n=1.4 to Si n=3.8->2.4). With such a layer the reflection at the silicon interface can be significantly reduced. With an appropriate thickness of the CSL the reflection at a certain wavelength can be reduced to values below 5% even without an ARC layer.

Figure 3:
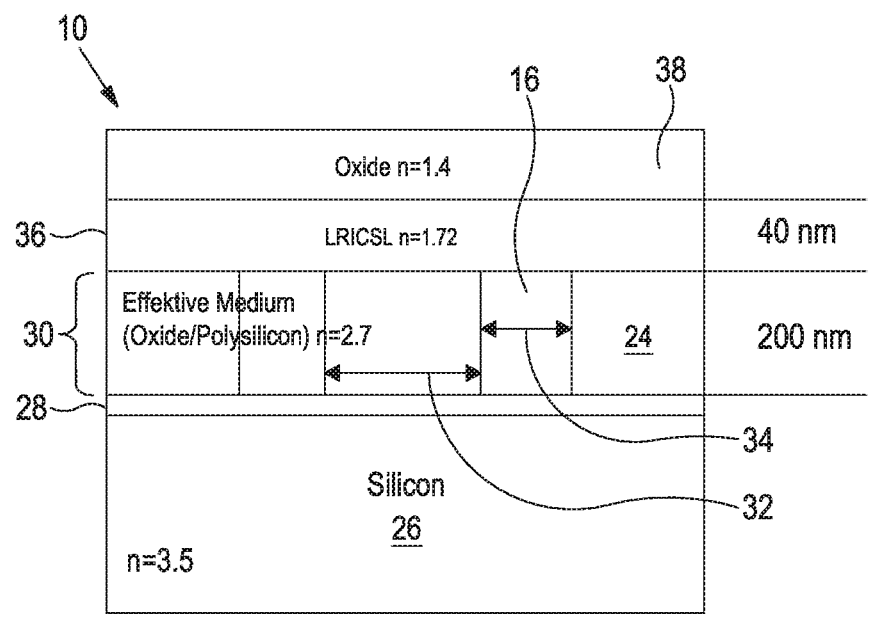
FIG. 3 shows a cross section of a semiconductor device according to an embodiment.

FIG. 3 shows a cross-section of a semiconductor device 10 according to an embodiment. For ease of understanding, features similar to those of the semiconductor device of FIG. 2 have been given the same reference numerals in FIG. 3. The device 10 comprises a silicon layer 26, which is doped so as to form a photodiode with a pn-junction (not shown). A patterned polysilicon layer 16, having a thickness of 200 nm, is located on the silicon layer 26, with a gate oxide layer 28 in between. The polysilicon layer 16 forms part of a resistor, such as the resistor 14 of the device 10 in FIG. 2. The holes 24 in the polysilicon layer 16 extend through the whole thickness of the polysilicon layer 16, and are filled with silicon oxide. The polysilicon and the oxide filled holes 24 from an effective medium 30 having a refractive index n=2.7. The holes 24 have a width 32 (e.g. 250 nm) and a spacing 34 (e.g. 180 nm) between adjacent holes 24, to produce the desired refractive index. A 40 nm thick CSL 36 is formed on the patterned polysilicon layer 16. The CSL 36 has a refractive index of n=1.72, which further reduces the difference in refractive index between adjacent layers in the light path. On top of the CSL 36 is an oxide layer 38 (having a refractive index of 1.4, as discussed above), which may be one of the normal oxide isolation layers formed in a CMOS backend process. The finished device 10 may comprise a number of metal layers (not shown) as well as further oxide layers (not shown).

Embodiments described herein may be particularly advantageous for use in the infrared (IR) wavelength spectrum (typically 700 nm<λ<1 mm). For IR light there is little to no absorption in the polysilicon layer, so a patterned resistor can be placed directly on top of the optical active region and does not require any additional space. In a passively quenched SPAD, this means that the resistor does not limit the fill factor and would thereby improve the light coupling into the SPAD.

The resistor and ARC layer is separated from the doped silicon by a gate oxide layer (as seen in FIG. 3). The voltage swing between the SPAD doping underneath the resistor and the resistor should be smaller than the gate oxide breakdown voltage (e.g. 3.3 V). The resistor is tied with one end to the SPAD device and must quench the avalanche current. This is done by causing a voltage drop across the resistor, which is big enough to reduce the voltage in the SPAD below breakdown. Hence, there is a potential difference between the doped Silicon (anode or cathode) of the SPAD and the quenching resistor. Both are isolated from each other by the gate oxide. This gate oxide has a limit in its voltage capabilities. For example, if the "POLY" of a CMOS process with a 3.3 V gate oxide is used, then the poysilicon resistor voltage difference to the voltage at the uppermost doping of the SPAD, must be smaller than the 3.3. V breakdown limit of the gate oxide. Otherwise there would be a leakage path from the resistor through the gate oxide into the SPAD and the device would not function property.

Figure 4:
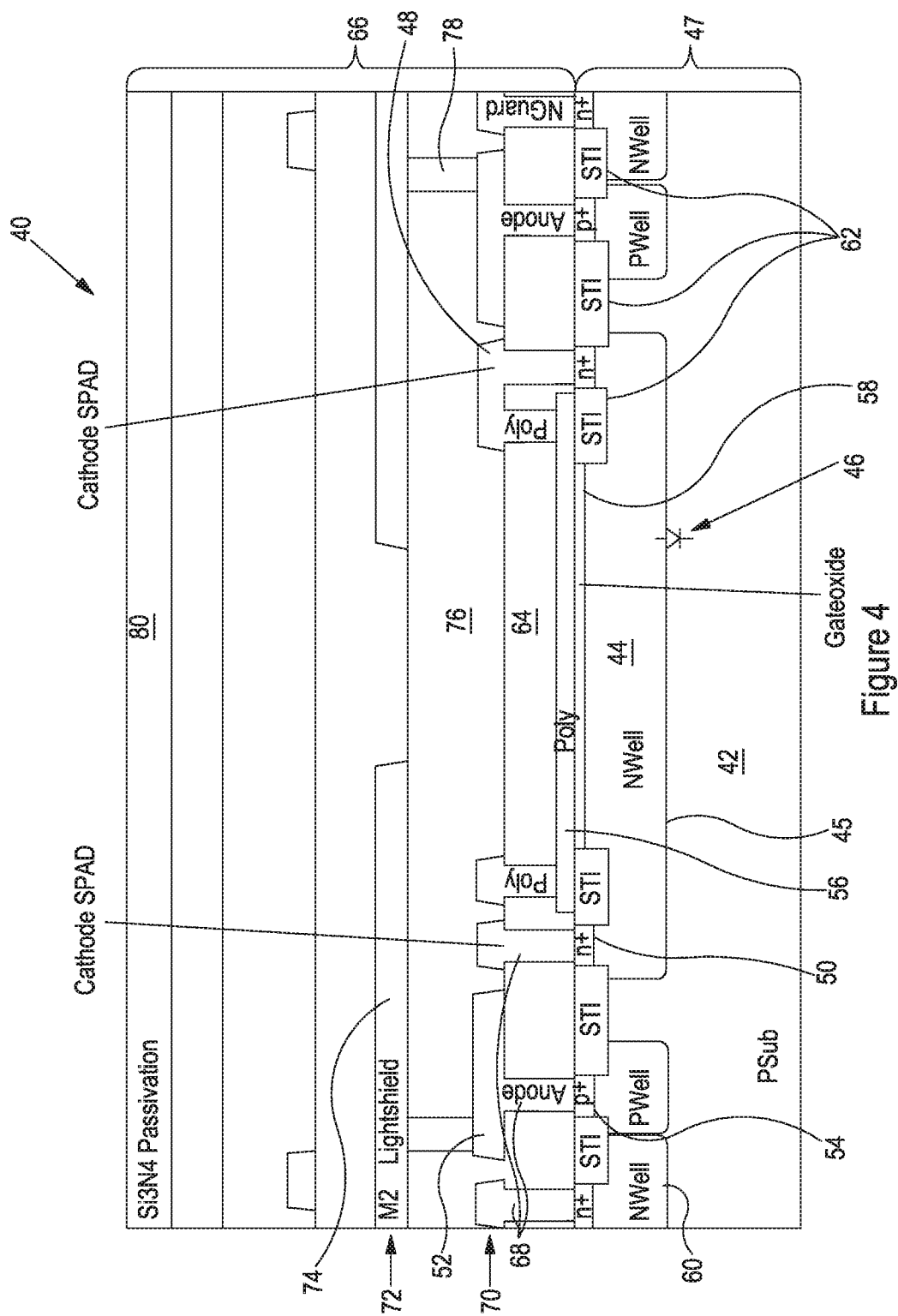
FIG. 4 shows a cross section of a single photon avalanche diode according to an embodiment.

FIG. 4 shows a cross-section of a lateral SPAD device 40 according to an embodiment. The device 40 is a CMOS device and comprises a p-substrate 42 and an n-well 44 forming a pn-junction 45 and photodiode 46 in the silicon layer 47. A metal contact 48 connects to a heavily doped n+ region 50 in the n-well 44. Another metal contact 52 connects to a heavily doped p+ region 54. In use, a reverse bias voltage is applied to the photodiode 46 by connecting the metal contacts 48 and 52 so that the first metal contact 48 becomes the cathode and the other metal contact 52 becomes the anode of the device 40. The cathode 48 is also connected to a patterned polysilicon resistor 56 overlapping the pn-junction 45 between the p-substrate 42 and the n-well 44. The resistor 56 is an anti-reflective coating (ARC) layer, which overlaps the optical active region of the photodiode 46 defined by the pn-junction 45. A gate oxide layer 58 isolates the resistor 56 from the n-well 44. An n-well guard ring 60 is used to isolate the SPAD device 40 from other CMOS components (not shown) such as adjacent SPADs in a SiPM. Shallow trench isolation (STI) trenches 62 isolate heavily doped regions in the silicon layer 47 from each other to improve breakdown performance. A first oxide isolation layer 64 of the CMOS backend stack 66 is located on the silicon layer 47 and on the pattered polysilicon resistor 56. Vias 68 connect the doped regions of the silicon layer 47 to the first metal layer 70 of the backend stack 66. The backend stack 66 comprises a second metal layer 72 with a light shield 74. The first and second metal layers 70 and 72 are separated by a second oxide isolation layer 76 and connected by vias 78. The backend stack 66 comprises a silicon nitride ($Si_3N_4$) passivation layer 80 on top, which protects the underlying layers.

Figure 5:
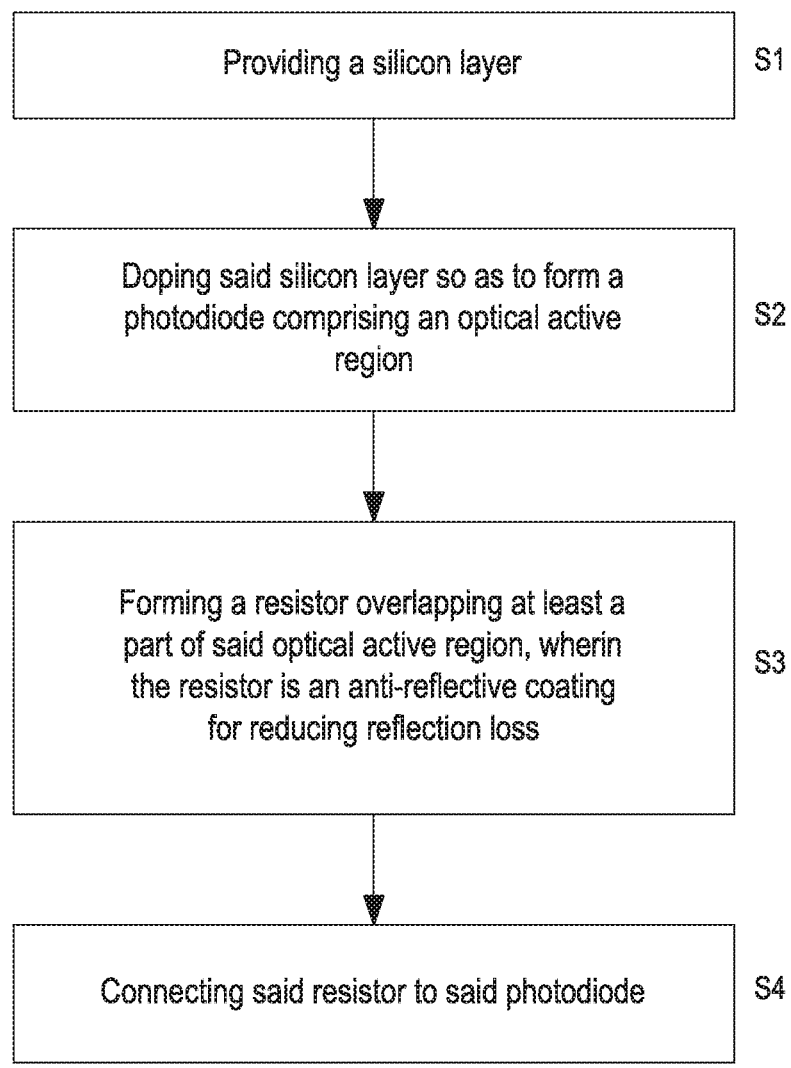
FIG. 5 is a flow diagram illustrating the steps of a method of forming a semiconductor device according to an embodiment.

FIG. 5 is a flow diagram illustrating the steps of a method of forming a semiconductor device, such as the SPAD device 40 shown in FIG. 4. The method comprises providing a silicon layer (step S1), doping said silicon layer to form a photodiode having an optical active region (step S2), forming a resistor overlapping at least a part of said optical active region, wherein the resistor is an anti-reflective coating for reducing reflection loss (step S3), and connecting said resistor to said photodiode (step S4). In one embodiment, the step of forming the resistor (step S4) comprises depositing a poysilicon layer, patterning said polysilicon layer to form a plurality of holes extending through said polysilicon layer, and filling said holes with dielectric material (e.g. $SiO_2$) so that the resistor comprises an effective medium having a refractive index between 1.4 and 3.5 (for light in the visible spectrum). Preferably, the method is performed as part of a standard CMOS process, and the poysilicon layer is patterned using the "POLY" mask of the CMOS process.

Figure 6:
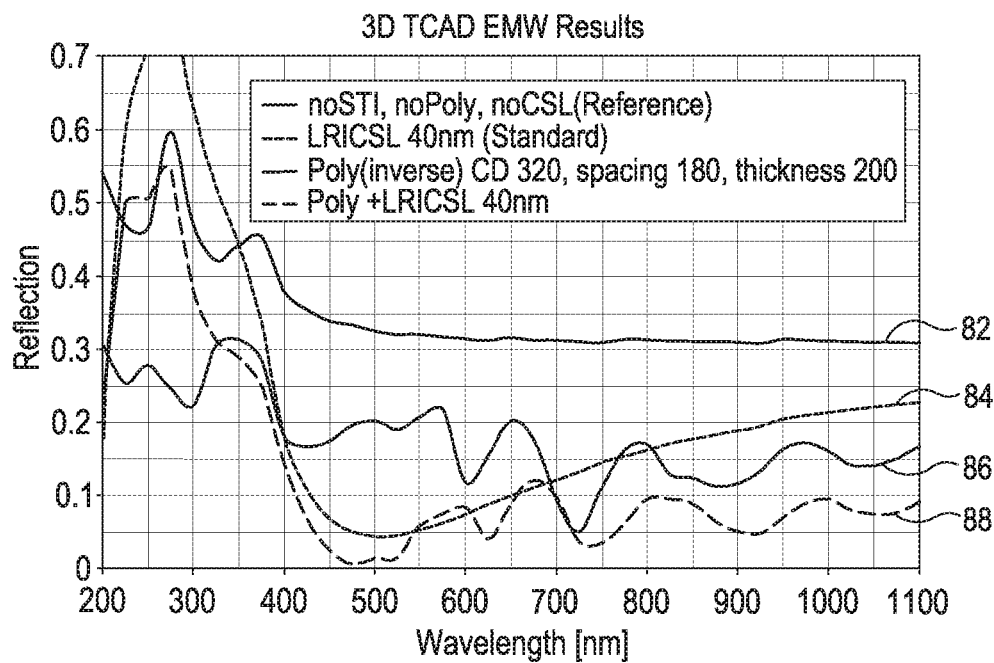
FIG. 6 is a graph showing simulated reflection plotted against wavelength.

FIG. 6 shows the simulated reflection coefficient plotted against wavelength for different semiconductor structures 82, 84, 86 and 88. 3D simulation with Synopsys EMW (Electromagnetic Wave Solver) was used. The reflection coefficient for the case of no matching layers 82 and for a 40 nm CSL 84 are plotted for comparison. The CSL 84 already acts quite well as an ARC layer, but is strongly wavelength dependent and not optimal for IR. In the case of a patterned poysilicon layer 86, the reflection is reduced very well across the whole wavelength range, especially in the red/IR wavelength region. In the blue/UV range the absorption in polysilicon reduces the positive effect, but still allows use of the patterned polysilicon resistor in the optical path. The light is not completely blocked by the patterned polysilicon resistor, which it would have been by a conventional, continuous, polysilicon resistor. In the case of a patterned polysilicon layer combined with a CSL 88, the device performs very well in the red/IR region, but the reflection coefficient is greater than that of patterned polysilicon without CSL 86 for wavelengths below 330 nm.

Figure 7:
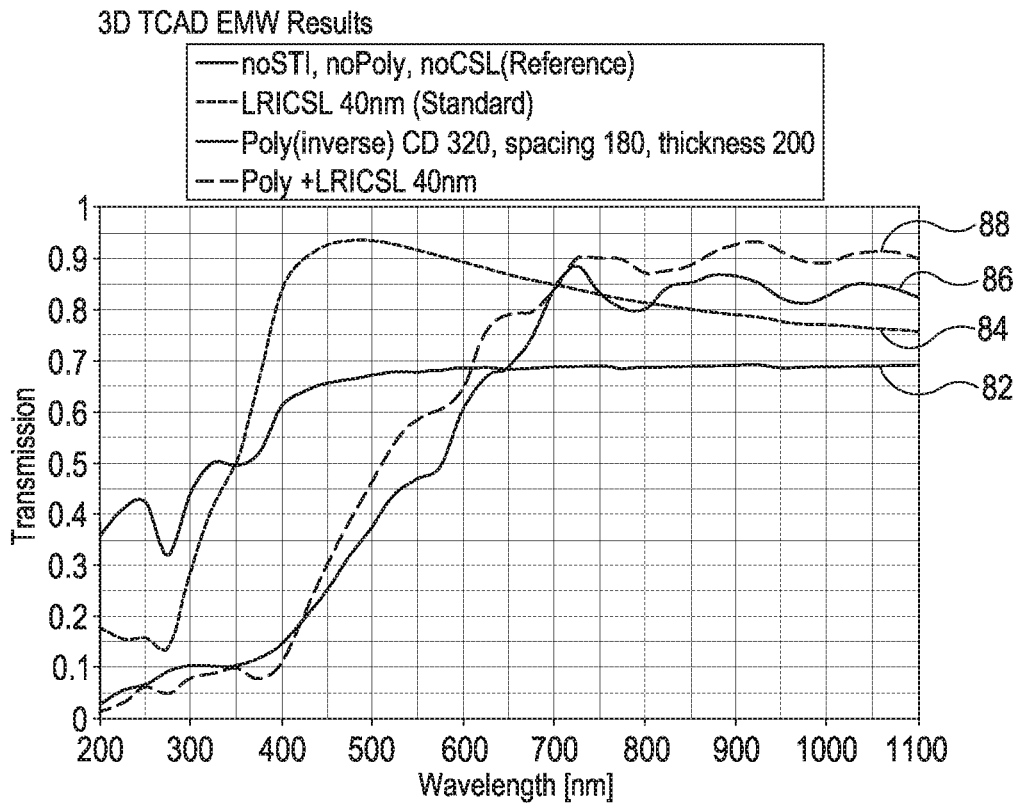
FIG. 7 is a graph showing simulated transmission plotted against wavelength.

FIG. 7 shows the simulated transmission coefficient plotted against wavelength for different semiconductor structures 82, 84, 86 and 88. The transmission coefficient for the case of no matching layers 82 and for a 40 nm CSL 84 are plotted for comparison. In general, for both patterned poysilicon 86 and for patterned poysilicon combined with a CSL 88 the transmission performance at low wavelengths is reduced due to absorption, but good performance is achieved for IR. The transmission into silicon proves that a gain of 15% should be achievable and without requiring modification of the CSL. There is still one oxide to air interface in both structures 86 and 88, which causes 3.5% reflection, so the reflection at the silicon interface is actually as low as 4%.

While specific embodiments of the invention have been described above, it will be appreciated that the invention may be practiced otherwise than as described. The descriptions above are intended to be illustrative, not limiting. It will be apparent to one skilled in the art that modifications may be made to the invention as described without departing from the scope of the claims set out below.

Each feature disclosed or illustrated in the present specification may be incorporated in the invention, whether alone or in any appropriate combination with any other feature disclosed or illustrated herein.

The invention claimed is:

1. A semiconductor device for light detection comprising:
a photodiode comprising an optical active region; and
a resistor connected to said photodiode and overlapping at least a part of said optical active region, wherein the resistor comprises an anti-reflective coating for reducing reflection loss,
wherein the resistor comprises a patterned polysilicon layer comprising a plurality of holes, wherein said holes are filed with silicon oxide (SiO2).

2. A semiconductor device according to claim 1, wherein said resistor comprises an effective medium having a refractive index between 1.4 and 3.5 for light in the visible spectrum.

3. A semiconductor device according to claim 1, wherein said resistor has a resistance in the range of 30 kΩ to 150 kΩ.

4. A semiconductor device according to claim 1, wherein said holes have a width in the range of 200 nm to 700 nm, and wherein a spacing between neighbouring holes is in the range of 90 nm and 300 nm.

5. A semiconductor device according to claim 1, wherein said polysilicon layer has a thickness in the range of 100 nm and 350 nm.

6. A semiconductor device according to claim 1, wherein said holes are one of square, round and hexagonal.

7. A semiconductor device according to claim 1 further comprising a contact stop layer comprising silicon nitride (Si3N4) or silicon oxynitride (SIGN) located on said resistor, and a silicon oxide layer located on said contact stop layer.

8. A silicon photomultiplier (SiPM) comprising an array of a plurality of the semiconductor device of claim 1.

9. A semiconductor device according to claim 1, wherein the semiconductor device is a Single Photon Avalanche Diode (SPAD).

10. A semiconductor device according to claim 1, wherein the resistor is configured to quench an avalanche current in the photodiode when in use.

11. A method of forming a semiconductor device for light detection, the method comprising:
providing a silicon layer;
doping said silicon layer so as to form a photodiode comprising an optical active region;
forming a resistor overlapping at least a part of said optical active region, wherein the resistor is formed from an anti-reflective coating for reducing reflection loss; and
connecting said resistor to said photodiode,
wherein forming said resistor comprises:

depositing a polysilicon layer;

patterning said polysilicon layer to form a plurality of holes extending through said polysilicon layer; and filling said holes with silicon oxide (SiO2) so that the resistor comprises an effective medium having a refractive index between 1.4 and 3.5 for light in the visible spectrum.

12. A method according to claim 11, wherein said method is performed as part of a standard Complementary Metal Oxide Semiconductor (CMOS) process, and wherein said step of patterning said polysilicon layer comprises using the "POLY" mask of the CMOS process.

13. A method according to claim 11, further comprising designing said resistor to have a target resistance and a target refractive index.

* * * * *